(12) United States Patent
Shafeeu et al.

(10) Patent No.: US 10,663,995 B2
(45) Date of Patent: May 26, 2020

(54) RESISTANCE CALIBRATION

(71) Applicant: SOCIONEXT INC., Yokohama-shi, Kanagawa (JP)

(72) Inventors: Hassan Shafeeu, Maidenhead (GB); Salvador Desumvila, Maidenhead (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/244,005

(22) Filed: Jan. 9, 2019

(65) Prior Publication Data

US 2019/0227586 A1  Jul. 25, 2019

(30) Foreign Application Priority Data

Jan. 19, 2018  (EP) ..................... 18152589

(51) Int. Cl.
| | |
|---|---|
| *G05F 1/56* | (2006.01) |
| *G05F 1/46* | (2006.01) |
| *G01R 35/00* | (2006.01) |
| *H03K 19/00* | (2006.01) |
| *G01R 17/10* | (2006.01) |
| *G01R 31/28* | (2006.01) |

(52) U.S. Cl.
CPC ............. *G05F 1/56* (2013.01); *G01R 17/105* (2013.01); *G01R 31/2884* (2013.01); *G01R 35/007* (2013.01); *G05F 1/461* (2013.01); *G05F 1/468* (2013.01); *H03K 19/0005* (2013.01)

(58) Field of Classification Search
CPC combination set(s) only.
See application file for complete search history.

(56) References Cited

U.S. PATENT DOCUMENTS

| | | | |
|---|---|---|---|
| 6,343,024 B1* | 1/2002 | Zabroda | .............. H04L 25/0266 323/208 |
| 7,639,038 B2 | 12/2009 | Nemoto et al. | |
| 9,236,863 B2* | 1/2016 | Jones | ............. H03K 19/017545 |
| 2004/0119524 A1 | 6/2004 | Tauber et al. | |
| 2007/0216441 A1 | 9/2007 | Nemoto et al. | |
| 2008/0143377 A1 | 6/2008 | Cho et al. | |
| 2011/0115509 A1 | 5/2011 | Kim et al. | |
| 2014/0125362 A1 | 5/2014 | Chang | |
| 2014/0184267 A1 | 7/2014 | Jones et al. | |

OTHER PUBLICATIONS

Extended European Search Report of related European Patent Application No. 18152589.0, dated Jul. 30, 2018.

* cited by examiner

*Primary Examiner* — An T Luu
(74) *Attorney, Agent, or Firm* — Arent Fox LLP

(57) ABSTRACT

The present invention relates to resistance calibration and in particular to resistance calibration in the context of semiconductor integrated circuitry.

16 Claims, 6 Drawing Sheets

RESISTANCE CALIBRATION

CROSS-REFERENCE TO RELATED APPLICATION

This application claims priority from European Patent Application No. 18152589.0 flied Jan. 19, 2018. The entire contents of the prior application are incorporated herein by reference.

The present invention relates to resistance calibration and in particular to resistance calibration in the context of semiconductor integrated circuitry.

By way of example, FIG. 1 is a schematic diagram of a circuitry system 1. Circuitry system 1 comprises a semiconductor integrated circuit 10, test equipment 30 and a computer 40.

The semiconductor integrated circuit 10 comprises a variable resistor 12, which itself comprises a non-variable resistor 14 and a variable resistor 16. Since the non-variable resistor 14 and the variable resistor 16 are connected together (in this case, in parallel) they form variable resistor 12.

Reference may be made to FIG. 2, which is a schematic diagram of an example implementation of variable resistor 16. In this implementation, the variable resistor 16 comprises an array of four non-variable (e.g., unit value) resistors 16-R0 to 16-R3 which may be selectively connected into or out of a parallel arrangement with respective switches (in this case, MOSFET transistors) 16-T0 to 16-T3. Of course, the number of such resistor/switch parallel paths need not be four; any number of them may be employed including one where there is the non-variable resistor 14 as in FIG. 1. Where there are two or more such resistor/switch parallel paths, the variable resistor 16 could serve as the entire variable resistor 12 (i.e., dispensing with the non-variable resistor 14).

The switches 16-T0 to 16-T3 are connected to receive respective control signals C0 to C3 from a control signal CONTROL which in this example may be a 4-bit digital control signal so that each switch may be turned on or off independently. Naturally, the control signal CONTROL may be encoded in any way, for example as a 3-bit signal with decoding within the variable resistor 16. Also, the control signal CONTROL will depend on how many resistor/switch parallel paths there are. The control signal CONTROL is shown in FIG. 1 as being provided to the variable resistor 16 from a register (memory) 20 which will be discussed later.

Returning to FIG. 1, it may be advantageous to employ the non-variable resistor 14 within the variable resistor 12 for example where it is desired for the overall variable resistor 12 to have a target value. For example, in that case the resistance value of the variable resistor 16 might only need to cater for variance in the resistance value (i.e. from a target, designed or nominal value) of the non-variable resistor 14 from circuit to circuit due to process variation. The variable resistor 12, including the non-variable resistor 14 and the variable resistor 16, may be implemented in the semiconductor integrated circuit 10 as polysilicon resistors (often referred to as poly-resistors). Typically, the resistance of a polysilicoon resistor may vary with process by as much as ±20%. However, in many cases such variation with process may be undesirable.

One such case is exemplified in FIG. 1. The semiconductor integrated circuit 10 comprises, in addition to the variable resistor 12, a variable current source 18, the register 20, external terminals 22 and 24, a high voltage source 26 (e.g., $V_{DD}$ or $V_{TOP}$) and a low voltage source 28 (e.g., ground or GND). In this example, the variable current source 18 represents the output stage of digital-to-analogue converter (DAC) circuitry, which may also be implemented on the semiconductor integrated circuit 10, and is connected between the external terminal 22—which serves as an output terminal—and the low voltage source (GND) 28. The variable resistor 12 is connected between the output terminal 22 and the high-voltage source ($V_{TOP}$) 26 and serves as a termination resistor for that output terminal 22.

As is well known, typically such an output terminal is designed to have a 50Ω termination resistor (100Ω differential) as an internal load to match an equivalent external load. It is important for the internal and external loads to match to avoid signal reflections. Such signal reflections may manifest themselves as noise on the output signal of the DAC circuitry.

With an example process variation of up to ±20% for the polysilicon resistors, an intended 50Ω termination resistor (i.e., of nominal value 50Ω) may have a resistance value anywhere between 40Ω and 60Ω. In the case of the example DAC circuitry output in FIG. 1, this can cause reflections to be suffered at the output terminal causing amplitude change and also amplitude ripple on the DAC output signal in the bandwidth of interest. This may be appreciated by reference to FIG. 3.

FIG. 3 is a gain versus frequency graph indicating the results of a simulation of the DAC gain versus frequency for multiple values of (input) resistor due to process variations. It can be seen that the gain varies at low frequency and that across the frequency bandwidth there is as much as 1.5 dB amplitude ripple. Such amplitude ripple may be undesirable or even intolerable in wideband system design.

The idea in FIG. 1 is thus to trim or control or calibrate the resistance of the variable resistor 12 (specifically, the variable resistor 16) until it has a target resistance (e.g., 50Ω), with a more acceptable variance such as ±2%. This is achieved in FIG. 1 by way of the test equipment 30 and the computer 40.

The test equipment 30 is connected to the output terminal 22, and in conjunction with the computer 40 is configured to control a value (i.e. a control value) stored in the register 20. This value stored in register 20 governs the control signal CONTROL which as explained above controls the resistance of the variable resistor 16 and in turn the variable resistor 12. The test equipment 30 may measure the resistance of the variable resistor 12 or may for example be sophisticated enough to measure reflections (for example, measuring frequency response as the DAC outputs a test output signal) and, in conjunction with the computer 40, controls the resistance of the variable resistor 12 to reach a target resistance or to minimise the reflections (at which point the variable resistor 12 is taken to have the target resistance—e.g., 500±2%).

However, it is inconvenient to have to attach the test equipment 30 and computer 40 and control the value of the variable resistor 12 in this way. For example, the terminals 22 and 24 may need to be dedicated "test" terminals, constituting an unwanted overhead in the semiconductor integrated circuit (e.g. IC chip) design. Also, the test equipment 30 and computer 40 may be expensive, and the test process may be time intensive, adding further unwanted cost and overhead. Still further, such a test may use a loadboard which may have long traces from the output terminal 22 making it difficult to measure the internal load accurately. Controlling the process of manufacture of the semiconductor integrated circuit 10 to reduce the variance in the resistance value of the polysilicon resistors themselves from up to ±20% down to e.g., up to ±2% is unfortunately not a practical or viable option at this time.

It is desirable to solve some or all of the above problems, in particular to overcome or mitigate the problem of undesirable variance in resistor value over (manufacturing) process.

According to an embodiment of a first aspect of the present invention, there is provided a semiconductor integrated circuit configured for resistance self-calibration, the semiconductor integrated circuit comprising: a reference voltage generator comprising a first resistor and a second resistor a first part of a test voltage generator comprising a third resistor, the third resistor being a variable resistor; and control circuitry, wherein: the reference voltage generator is configured to apply a first given voltage difference across the first resistor thereby to operate as a reference current source and cause a reference current to flow through the first resistor, to generate a first resultant voltage difference over the second resistor based on the reference current and to generate a reference voltage signal which is dependent on that first resultant voltage difference; the semiconductor integrated circuit comprises an external terminal for connection to an external fourth resistor forming a second part of the test voltage generator; the first part of the test voltage generator is configured, when the fourth resistor is connected to the external terminal, to apply a second given voltage difference across the fourth resistor thereby to operate as a test current source and cause a test current to flow through the fourth resistor, to generate a second resultant voltage difference over the third resistor based on the test current and to generate a reference voltage signal which is dependent on that second resultant voltage difference; and the control circuitry is operable based on the reference voltage signal and the test voltage signal to control the resistance of the third resistor to bring the test voltage signal and the reference voltage signal into a target relationship and thereby calibrate the third resistor.

In this way, by using the fourth resistor in a case where it suffers from a lower variance due to process than the other resistors, the third resistor can be calibrated to bring its resistance value accurately to a target value.

The external terminal at which it is connected may comprise a pair of nodes so that the fourth resistor can be connected to a voltage source such as ground so that a current path is formed from that voltage source through the fourth and third resistors to another voltage source.

The target relationship may be such that the test voltage signal and the reference voltage signal have equal voltage levels, or voltage levels within a given range of one another.

The first and second resistors may have resistance values (whose accuracy is) dependent on a first manufacturing process used to manufacture the semiconductor integrated circuit whereas the fourth resistor is external to the semiconductor integrated circuit and may have a resistance value (whose accuracy is) dependent upon a second manufacturing process used to manufacture the fourth resistor and different from the first manufacturing process. In the target relationship, the third resistor may have a target resistance value (whose accuracy is) limited by the second manufacturing process and the resolution in resistance value of the third resistor rather than by the first manufacturing process.

The first given voltage difference may be the same as the second given voltage difference.

The semiconductor integrated circuit may comprise bandgap voltage reference circuitry operable to output a bandgap voltage reference signal. The first and/or second given voltage differences may be generated based on the bandgap voltage reference signal.

The reference voltage generator may be configured to direct the reference current through the second resistor so as to generate the voltage drop over that resistor. The test voltage generator may be configured to direct the test current through the third resistor so as to generate the voltage drop over that resistor.

The third resistor may comprise an array of fixed-value resistors, and switching circuitry operable under control by the control circuitry to selectively control which of the fixed-value resistors are conductively connected together to control the resistance of the third resistor.

The control circuitry may comprise a comparator connected to output a comparison signal dependent on a difference in voltage level between the test voltage signal and the reference voltage signal. The control circuitry may comprise logic configured to adjust the resistance of the third resistor based on the comparison signal to reduce or minimise the difference in voltage level between the test voltage signal and the reference voltage signal. Such logic may be implemented by a processer executing a computer program, or for example in "hardwired" digital logic circuitry.

The semiconductor integrated circuit may comprise a (or at least one) fifth resistor configured in the same way as the third resistor, wherein the control circuitry is configured to control the (at least one) fifth resistor in the same way as the third resistor. Thus, it may be possible to bring more than one resistor to the target resistance value.

The control circuitry may be configured to control the at least one fifth resistor in the same way as the third resistor once the test voltage signal and the reference voltage signal have been brought into the target relationship.

The control circuitry may be configured to control the third and at least one fifth resistors with a control signal having a variable control value. The control circuitry may comprise a memory configured to store the control value based on which the test voltage signal and the reference voltage signal have been brought into the target relationship. The control circuitry may be configured, after having brought the test voltage signal and the reference voltage signal into the target relationship, to control the at least one fifth resistor using the control value stored in the memory. Thus, the control value stored in the memory may serve as a calibration value which can be used for more than one resistor. That value may be retained in the memory, as being applicable for that particular semiconductor integrated circuit.

The at least one fifth resistor, or a said fifth resistor, may be configured to act as a termination resistor at an external terminal of the semiconductor integrated circuit. This is however just an example.

The control circuitry may be configured to control the reference voltage generator to adjust the first given voltage difference and/or the test voltage generator to adjust the second given voltage difference, so as to adjust a target resistance value to which the third resistor is calibrated.

The semiconductor integrated circuit may be an IC chip or an output circuit.

According to an embodiment of a second aspect of the present invention, there is provided an IC package, comprising: the semiconductor integrated circuit according to the aforementioned first aspect of the present invention; and the fourth resistor, wherein the fourth resistor is connected to the external terminal of the semiconductor integrated circuit.

The present invention extends to method and computer program aspects (e.g. for control) corresponding to the apparatus (circuit) aspects.

Reference will now be made, by way of example only, to the accompanying drawings, of which:

FIG. 1, mentioned above, is a schematic diagram of a circuitry system useful for performing resistance calibration;

FIG. 2, mentioned above, is a schematic diagram of an example implementation of a variable resistor of the FIG. 1 circuitry system;

FIG. 3, mentioned above, is a gain versus frequency graph indicating the results of a simulation of DAC gain versus frequency for multiple values of (input) resistor due to process variations;

FIG. 4 is a schematic diagram of a semiconductor integrated circuit 100 embodying the present invention.

Figure 1:
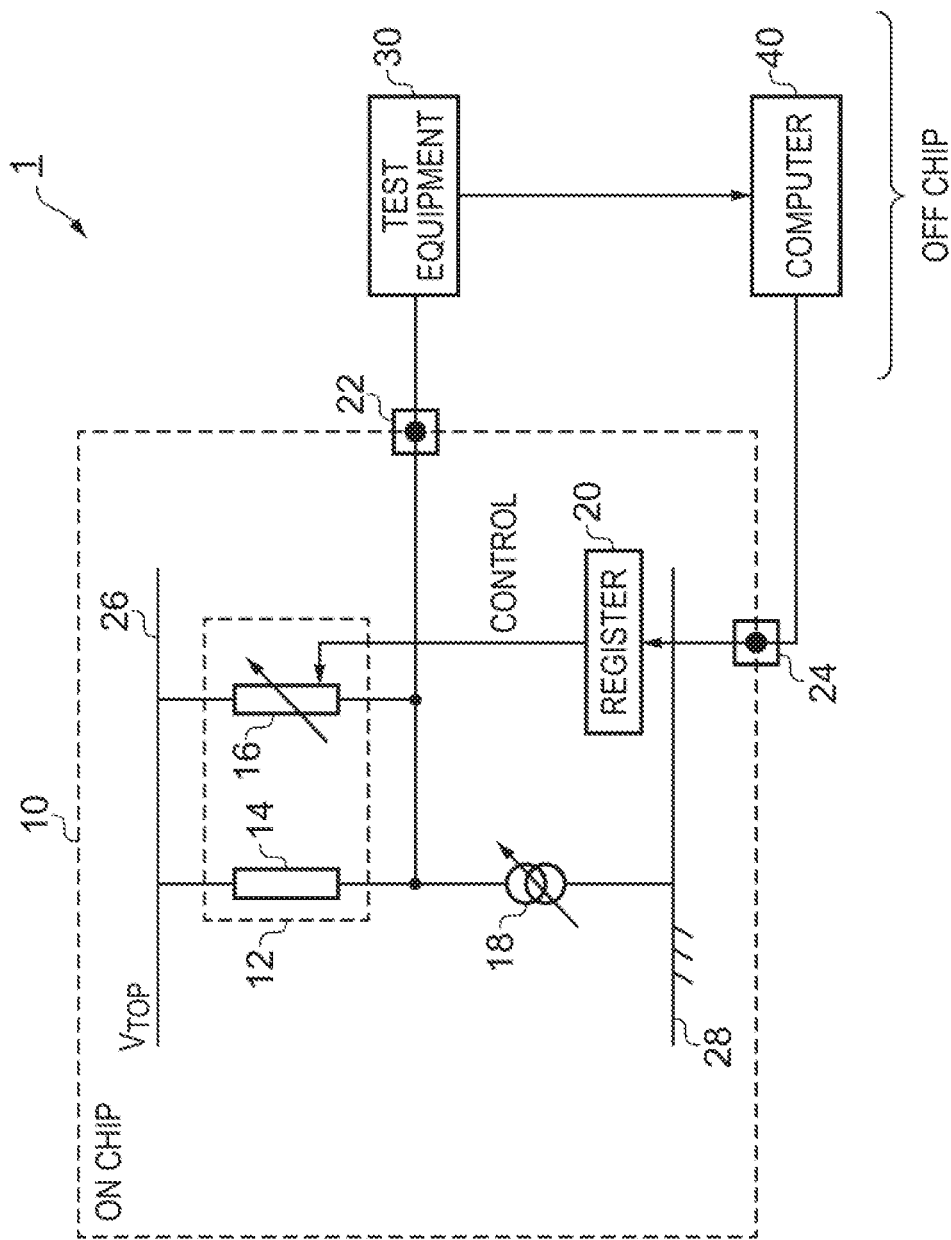
Figure 4:
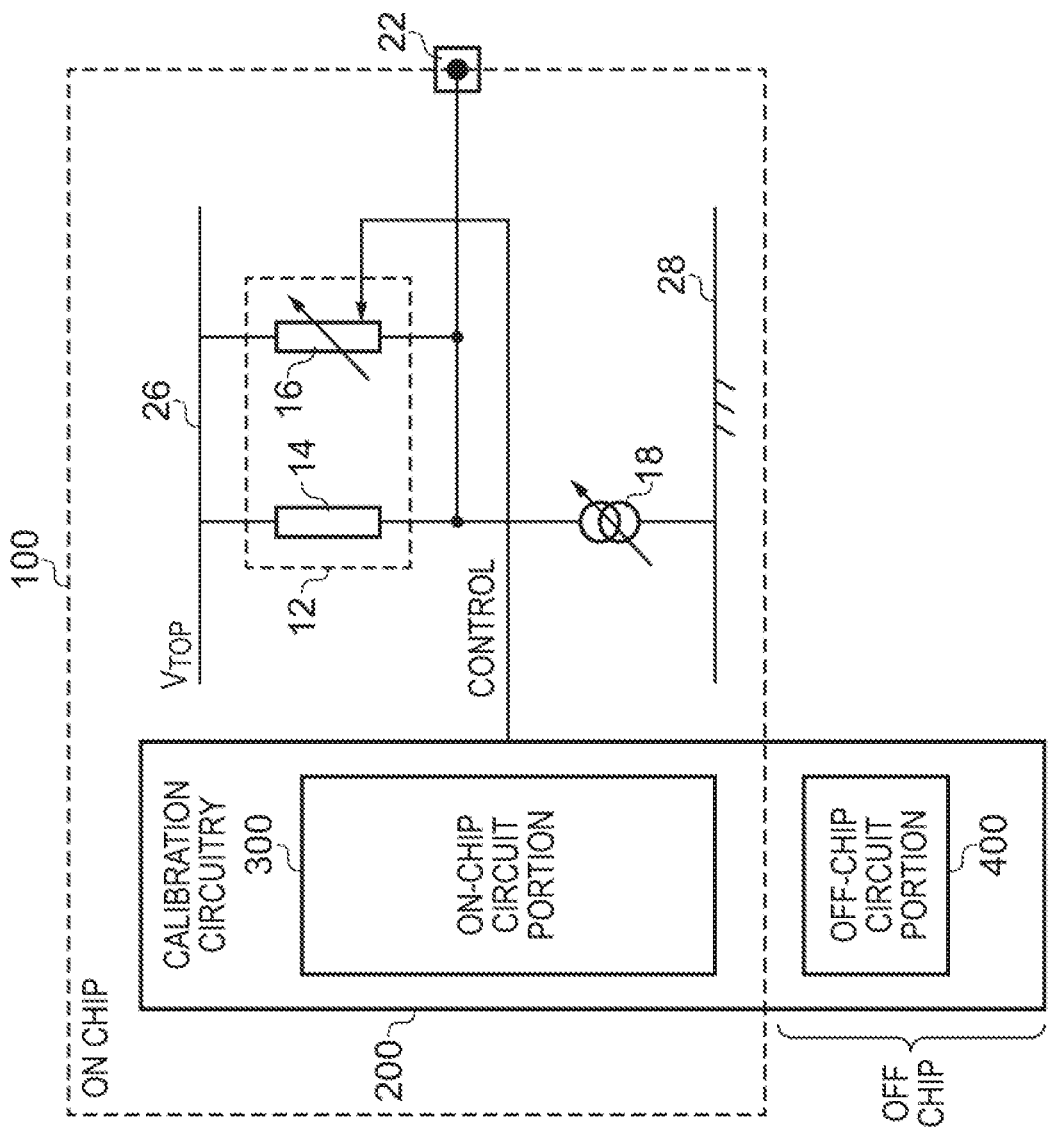
FIG. 4 is a schematic diagram of a semiconductor integrated circuit embodying the present invention.

For ease of comparison, elements of the semiconductor integrated circuit 10 of FIG. 1 have been reproduced in the semiconductor integrated circuit 100 of FIG. 4. Thus, the semiconductor integrated circuit 100 comprises the variable resistor 12, itself comprising the non-variable resistor 14 and the variable resistor 16, the variable current source 18, the external terminal 22, the high-voltage source (e.g., $V_{DD}$ or $V_{TOP}$) 26 and the low-voltage source (e.g., GND) 28. Again, the variable current source 18 is taken to represent the output stage of DAC circuitry, which may be implemented on the semiconductor integrated circuit 100, and is connected between the external (output) terminal 22 and the low-voltage source 28. The variable resistor 12 is again connected between the output terminal 22 and the high-voltage source ($V_{TOP}$) 26 and serves as a termination resistor for the output terminal 22.

Figure 2:
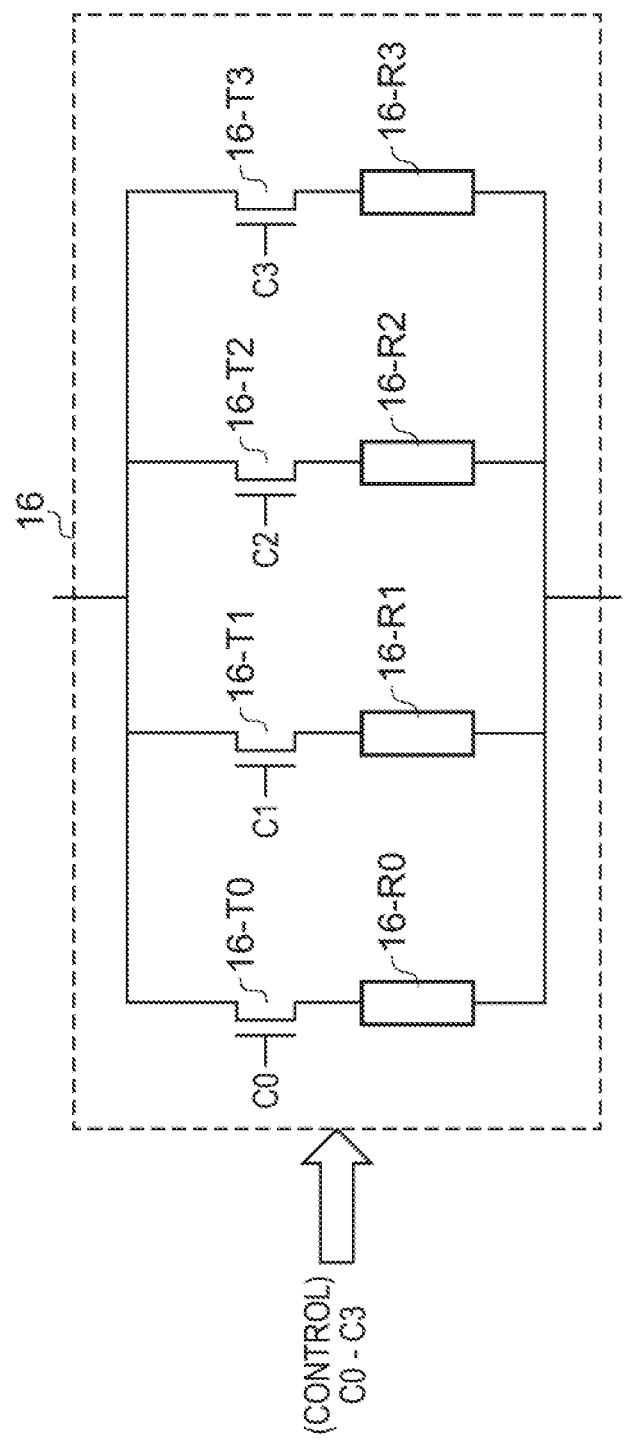
Figure 3:
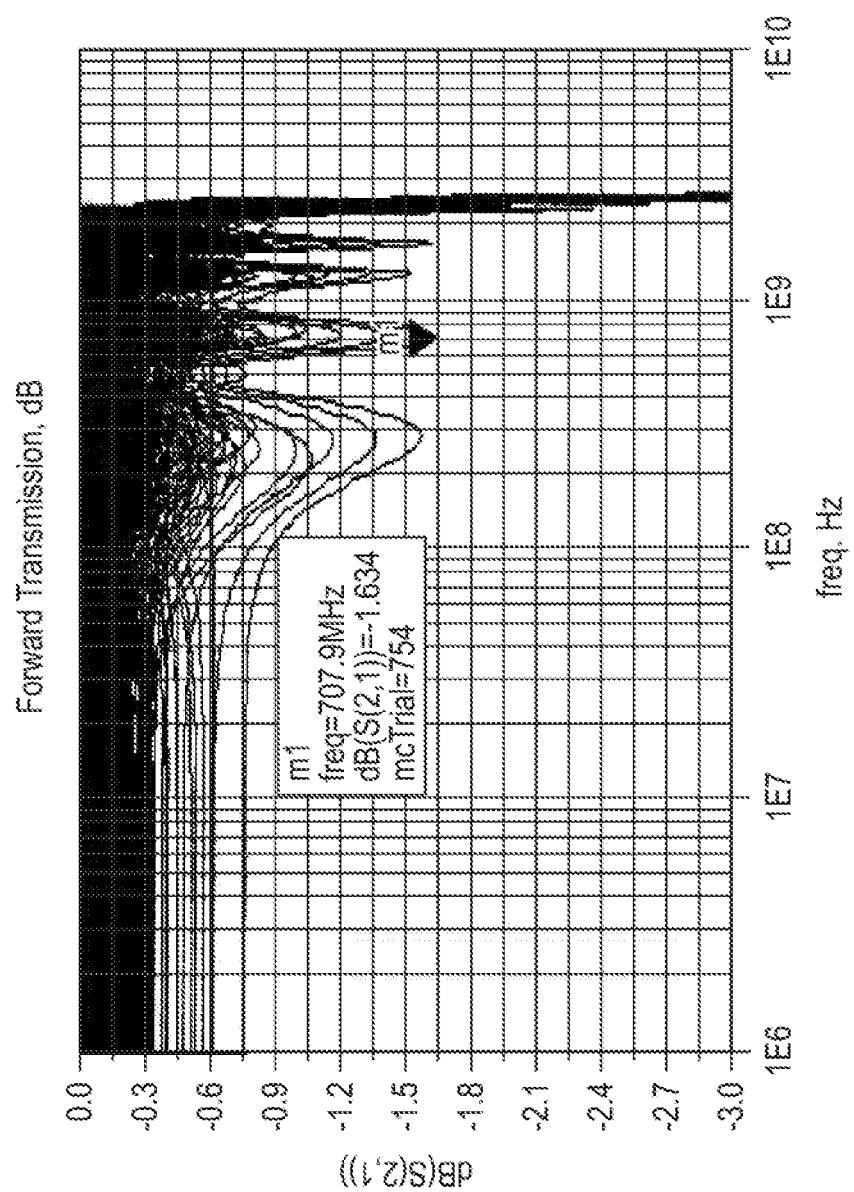

As shown in FIG. 4, however, the semiconductor integrated circuit 100 comprises calibration circuitry 200 which avoids the need to use the test equipment 30 and the computer 40. The calibration circuitry 200 is configured to generate the control signal CONTROL (which corresponds to that in FIGS. 1 and 2) to control the resistance of the variable resistor 16 and in turn the variable resistor 12. As indicated, the majority of the calibration circuitry 200 is provided on-chip. Specifically, the calibration circuitry 200 comprises an on-chip circuit portion 300 and an off-chip circuit portion 400. The on-chip circuit portion 300 is part of the semiconductor integrated circuit 100, and the off-chip circuit portion 400 is for connection to the semiconductor integrated circuit 100. The calibration circuitry 200, and indeed the on-chip circuit portion 300, themselves embody the present invention.

Figure 5:
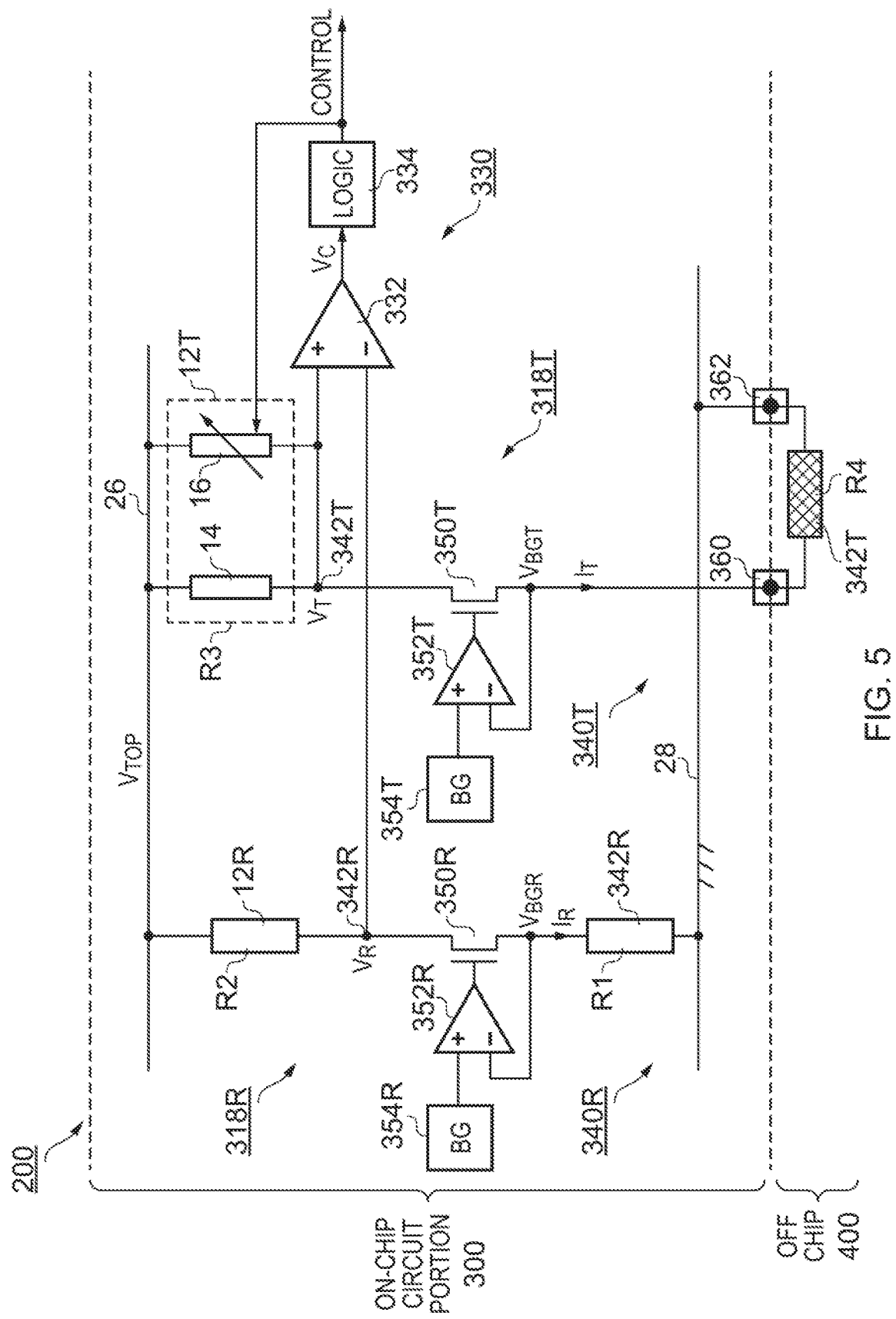
FIG. 5 is a schematic diagram indicating an example implementation of the calibration circuitry of FIG. 4.

FIG. 5 is a schematic diagram indicating an example implementation of the calibration circuitry 200. As before, the calibration circuitry comprises the on-chip circuit portion 300 (i.e., implemented as semiconductor integrated circuitry and part of the single overall semiconductor integrated circuit or chip 100) and the off-chip circuit portion 400 (i.e., not implemented on the semiconductor integrated circuit 100 itself). For example, in the case where the overall semiconductor integrated circuit 100 is in the form of an IC chip, the chip may be provided as part of an IC package, and the off-chip circuit portion 400 may be part of the IC package and connected to the IC chip, but not part of the IC chip itself.

The on-chip circuit portion 300, which itself embodies the present invention, comprises a reference voltage generator 318R, a test voltage generator 318T and control circuitry 330.

The reference voltage generator 318R comprises a reference current source 340R connected between a reference voltage node 342R and the low-voltage source (GND) 28, and a reference resistor 12R connected between the reference node 342R and the high-voltage source ($V_{TOP}$) 26, so as to form a current path from the high-voltage source ($V_{TOP}$) 26 via the reference resistor 12R, the reference node 342R and the reference current source 340R to the low voltage source (GND) 28.

The reference current source 340R comprises a reference resistor 342R, a transistor 350R, a differential amplifier 352R and a bandgap voltage generator 354R (being an example circuit suitable for creating a highly accurate reference voltage signal).

Numerous circuits for a bandgap voltage generators are known and thus need not be detailed here.

The transistor 350R and the reference resistor 342R are connected in series between the reference node 342R and the low voltage reference source 28 in that order. The differential amplifier (e.g., an operational amplifier) 352R is connected to drive the transistor 350R based on a bandgap reference voltage signal (at its non-inverting input) and a feedback reference signal (at its inverting input) taken from an intermediate node between the transistor 350R and the reference resistor 342R. Thus, the bandgap voltage (here denoted $V_{BGR}$) is applied and maintained (regulated) at the intermediate node and a corresponding potential difference is applied/maintained over the reference resistor 342R (since the reference resistor 342R is connected between the intermediate node and the low-voltage reference source (GND) 28).

Assuming that the reference resistor 342R is a polysilicon resistor having an intended (i.e., nominal) resistance R1 but with an error factor E1 due to process variation, then a reference current $I_R$ flowing in the current path of the reference voltage generator 318R is:

$$I_R = V_{BGR}/(R1 \times E1)$$

Assuming that the reference resistor 12R is also a polysilicon resistor having an intended resistance R2 but also with the error factor E1 due to process, then the voltage difference across the reference resistor 12R is:

$$V_{TOP} - V_R = I_R \times R2 \times E1$$
$$= (V_{BGR} \times R2 \times E1)/(R1 \times E1)$$
$$= V_{BGR} \times (R2/R1)$$

Thus, the voltage signal $V_R$ generated at the reference node 342R is:

$$V_R = V_{TOP} - [V_{BGR} \times (R2/R1)]$$

and is independent of the error factor E1.

It is incidentally noted that variance due to process across the same chip is ignored here as being very small (well below the target e.g. ±2% variance) and thus insignificant. Thus, E1 is applied here to both of R1 and R2.

It will be appreciated from FIG. 5 that the test voltage generator 318T is somewhat similar to the reference voltage generator 318R. However, unlike the reference voltage generator 318R, the test voltage generator 318T comprises a first part which is on-chip and is part of the on-chip circuit portion 300, and a second part which is off-chip and is part of the off-chip circuit portion 400.

The test voltage generator 318T comprises a test current source 340T connected between a test voltage node 342T and the low voltage source (GND) 28, and a test resistor 12T connected between the test node 342T and the high voltage source ($V_{TOP}$) 26, so as to form a current path from the high-voltage source ($V_{TOP}$) 26 via the test resistor 12T, the test node 342T and the test current source 340T to the low voltage source (GND) 28. It is noted here that the test resistor 12T is a replica of the resistor 12 in FIG. 4. That is to say that the test resistor 12T is a variable resistor configured in the same way as the variable resistor 12 in FIG. 4, i.e. having the non-variable resistor 14 and the variable resistor 16 connected together in parallel.

The test current source 342 comprises a test resistor 342T, a transistor 350T, a differential amplifier 352T and a reference voltage generator 354T, again in this case being a bandgap reference voltage generator. It is important to note that the test resistor 342T forms part of the second part of the test voltage generator 318T and is thus in the off-chip circuit portion 400. The test resistor 342T is connected to the first part of the test voltage generator 318T via external terminals 360 and 362 as indicated in FIG. 5.

Note as an aside that the test resistor 342T (or a similar one) may be used by other circuitry (not shown) to get a current which has been referred to that resistor (i.e. by applying a known potential difference over it).

The transistor 350T and test resistor 342T are connected in series between the test node 342T and the low-voltage reference source 28 in that order. The differential amplifier (e.g., and operational amplifier) 352T is connected to drive the transistor 350T based on a bandgap reference voltage signal (at its non-inverting input) and a feedback reference signal (at its inverting input) taken from an intermediate node between the transistor 350T and the test resistor 342T, so that the bandgap voltage (here denoted $V_{BGT}$) is maintained at the intermediate node and thus that a corresponding potential difference is maintained over the test resistor 342T.

Again it is important to note here that the (off-chip) test resistor 342T is assumed to be a relatively high accuracy resistor having an intended resistance R4. It is helpful to consider the test resistor 342T to have the resistance R4 but with an error factor E2 due to process, but with the error factor E2 being substantially less significant than the (on-chip, polysilicon resistor) error factor E1.

In this case, a test current $I_T$ flowing in the current path of the test voltage generator 218T is:

$$I_T = V_{BGT}/(R4 \times E2)$$

Assuming that the test resistor 12R is again a polysilicon resistor having an intended resistance R3 but also with the error factor E1 due to process, then the voltage difference across the test resistor 12T is:

$$V_{TOP} - V_T = I_T \times R3 \times E1$$
$$= (V_{BGT} \times R3 \times E1)/(R4 \times E2)$$
$$= V_{BGT} \times (R3/R4) \times (E1/E2)$$

Thus the voltage signal $V_T$ generated at the test node 342T is:

$$V_T = V_{TOP} - [V_{BGT} \times (R3/R4) \times (E1/E2)]$$

The control circuitry 330 comprises a differential amplifier 332 and logic circuitry (e.g. a digital calibration engine) 334. The differential amplifier 332 is connected to receive the reference voltage signal $V_R$ from the reference node 342R and the test voltage signal $V_T$ from the test node 342T at its input terminals, and to output a comparator-output signal $V_C$ based on a difference between the reference voltage signal $V_R$ and the test voltage signal $V_T$. The logic circuitry 334 is operable to control the variable resistor 12T using the control signal CONTROL based on the comparator-output signal $V_C$ so as to try to equalize (or minimize or reduce the difference between) the reference voltage signal $V_R$ and the test voltage signal $V_T$ to the extent that the resolution of the variable resistor 12 allows. Recall from FIG. 2 that the resistance of the variable resistor 12 (at least as configured as explained in relation to FIG. 2) is varied by switching individual resistances into or out of circuit, and thus that the resistance value of the variable resistor 12 may only adopt one of a plurality of possible values.

The control circuitry 330 is thus configured to try to set:

$$V_T = V_R$$

At this point, the actual value (R3×E1) of the test resistor 12T becomes:

$$R3 \times E1 = (V_{BGR}/V_{BGT}) \times ((R2 \cdot R4)/R1) \times E2.$$

Thus, the control signal CONTROL will adjust the resistance R3×E1 of the test resistor 12T until it reaches an actual value defined by $V_{BGR}/V_{BGT}$, the error factor E2 and the nominal (error-free) values R1, R2 and R4, and limited by the resolution of the variable resistor 12T (i.e., how close it can get to the ideal case $V_T = V_R$).

This control signal CONTROL (i.e. a control value at this point) thus calibrates the resistance of the variable resistor 12T to a known target value (subject to the above limitations), given known nominal values of R1, R2, and R4. If $V_{BGR} = V_{BGT}$ to a high accuracy (which is expected with bandgap voltage reference circuitry, particularly if the same such circuitry is used to provide $V_{BGR}$ and $V_{BGT}$), and if the error factor E2 is very close to 1 (e.g. 0.98 to 1.02, representing a variation of ±2%) then the effect of process variation in the resistance value of the polysilicon resistors, i.e., up to ±20%, is reduced to around ±2% in the value of the variable resistor 12T (limited by the resolution of the variable resistor 12T).

This control signal CONTROL (i.e. the control value at this point) can then be provided to the actual termination resistor 12 in FIG. 4, so that its accuracy is within ±2% of a target value (e.g., 50Ω). For example, the control value at that point may be stored in a register or memory equivalent to register 20 in FIG. 1, and the actual termination resistor 12 in FIG. 4 may be controlled based on the value stored in that register or memory. Thus, the calibration process carried out by the differential amplifier 332 and logic circuitry 334 based on the FIG. 5 circuitry may be carried for example once after manufacture of the semiconductor integrated circuit 100, or for example on startup of the semiconductor integrated circuit 100, with the control value arrived at then being stored in the register or memory for use thereafter.

Although only one resistor 12 in FIG. 4 is shown benefiting from this calibration, it will be appreciated that in a typical semiconductor integrated circuit such as semiconductor integrated circuit 100 there may be many resistors of the same type, i.e. in this case poly-resistors. The stored control value (arrived at by the calibration circuitry 200) may be used by any such resistors so that the accuracy of their values can be taken beyond the process-related accuracy (e.g. process variation of up to ±20%) to improved accuracy (e.g. process variation of up to ±2%).

Incidentally, looking again at the way the control circuitry 330 attempts to set the actual value (R3×E1) of the test resistor 12T, i.e. using $(V_{BGR}/V_{BGT}) \times ((R2 \cdot R4)/R1) \times E2$, it will be appreciated that with $V_{BGR}=V_{BGT}$ the values of R1, R2 and R4 may have each been set for a target resistance value of e.g. 50Ω (with ±2% variation). However, by varying the value of $V_{BGR}$ relative to $V_{BGT}$ the ratio $V_{BGR}/V_{BGT}$ could be varied and thus the target resistance value could also be varied. Thus, it will be appreciated that one of both of the current sources 340R and 340T could be adapted to allow one of both of $V_{BGR}$ and $V_{BGT}$ (and thus one or both of $I_R$ and $I_T$, or one of both of $V_R$ and $V_T$) to be varied to adjust the target resistance value. The present disclosure will be understood accordingly. This could readily be achieved by replacing one or both of the bandgap voltage generators 354R and 354T with a variable voltage generator.

It is incidentally noted that the transistors 350R and 350T could be implemented as BJTs rather than as MOSFETs or FETs. The present disclosure will be understood accordingly.

Figure 6:
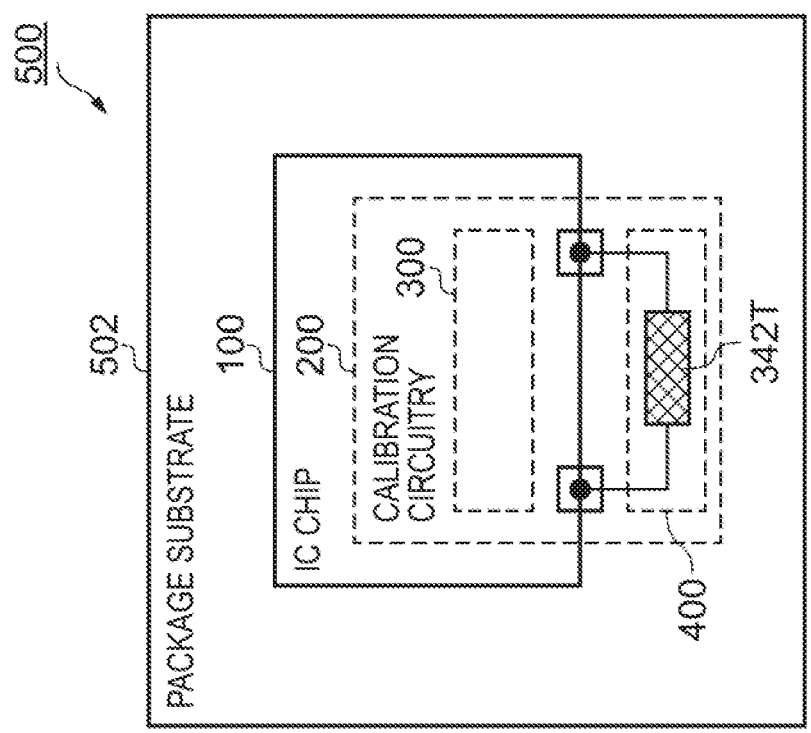
FIG. 6 is a schematic diagram of an IC package 500 embodying the present invention.

FIG. 6 is a schematic diagram of an IC package 500 embodying the present invention.

The IC package 500 comprises the semiconductor integrated circuit 100 of FIG. 4 in the form of an IC chip (such as a flip chip) mounted on a package substrate 502 of the IC package 500. Also mounted on the package is the off chip portion 400 (i.e. the test resistor 342T) of the calibration circuitry 200, with the on-chip portion 300 being part of the semiconductor integrated circuit 100 itself.

As above, the variable current source 18 of the semiconductor integrated circuit 100 is taken to represent the output stage of DAC circuitry, with the variable resistor 12 serving as a termination resistor for the output terminal 22. However, this is just an example. In another example, on the same chip or another chip, the variable resistor 12 may serve as a termination resistor for an input terminal, e.g. for ADC circuitry. Thus, each of the semiconductor integrated circuit 100 and the IC package 500 may be referred to as DAC and/or ADC circuitry, or simply as mixed-signal circuitry.

Circuitry of the present invention may thus be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

In any of the above (method or control) aspects, the various features may be implemented in hardware, or as software modules running on one or more processors. Features of one aspect may be applied to any of the other aspects. The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

Further embodiments may be provided within the spirit and scope of the present invention as disclosed herein.

The invention claimed is:

1. A semiconductor integrated circuit configured for resistance self-calibration, the semiconductor integrated circuit comprising:
    a reference voltage generator comprising a first resistor and a second resistor;
    a first part of a test voltage generator comprising a third resistor, the third resistor being a variable resistor; and
    control circuitry,
    wherein:
    the reference voltage generator is configured to apply a first given voltage difference across the first resistor thereby to operate as a reference current source and cause a reference current to flow through the first resistor, to generate a first resultant voltage difference over the second resistor based on the reference current and to generate a reference voltage signal which is dependent on that first resultant voltage difference;
    the semiconductor integrated circuit comprises an external terminal for connection to an external fourth resistor forming a second part of the test voltage generator;
    the first part of the test voltage generator is configured, when the fourth resistor is connected to the external terminal, to apply a second given voltage difference across the fourth resistor thereby to operate as a test current source and cause a test current to flow through the fourth resistor, to generate a second resultant voltage difference over the third resistor based on the test current and to generate a test voltage signal which is dependent on that second resultant voltage difference; and
    the control circuitry is operable based on the reference voltage signal and the test voltage signal to control the resistance of the third resistor to bring the test voltage signal and the reference voltage signal into a target relationship and thereby calibrate the third resistor.

2. The semiconductor integrated circuit as claimed in claim 1, wherein the target relationship is such that the test voltage signal and the reference voltage signal have equal voltage levels, or voltage levels within a given range of one another.

3. The semiconductor integrated circuit as claimed in claim 1, wherein:
    the first and second resistors have resistance values dependent on a first manufacturing process used to manufacture the semiconductor integrated circuit whereas the fourth resistor is external to the semiconductor integrated circuit and has a resistance value dependent upon a second manufacturing process used to manufacture the fourth resistor and different from the first manufacturing process; and
    in the target relationship the third resistor has a target resistance value whose accuracy is limited by the second manufacturing process and the resolution in resistance value of the third resistor rather than by the first manufacturing process.

4. The semiconductor integrated circuit as claimed in claim 1, wherein the first given voltage difference is the same as the second given voltage difference.

5. The semiconductor integrated circuit as claimed in claim 1, comprising bandgap voltage reference circuitry operable to output a bandgap voltage reference signal, and wherein the first or second given voltage differences are generated based on the bandgap voltage reference signal.

6. The semiconductor integrated circuit as claimed in claim 1, wherein the reference voltage generator is configured to direct the reference current through the second resistor so as to generate the voltage drop over that resistor.

7. The semiconductor integrated circuit as claimed in claim 1, wherein the test voltage generator is configured to direct the test current through the third resistor so as to generate the voltage drop over that resistor.

8. The semiconductor integrated circuit as claimed in claim 1, wherein the third resistor comprises an array of fixed-value resistors, and switching circuitry operable under control by the control circuitry to selectively control which of the fixed-value resistors are conductively connected together to control the resistance of the third resistor.

9. The semiconductor integrated circuit as claimed in claim 1, wherein the control circuitry comprises:
    a comparator connected to output a comparison signal dependent on a difference in voltage level between the test voltage signal and the reference voltage signal; and
    logic configured to adjust the resistance of the third resistor based on the comparison signal to reduce or minimise the difference in voltage level between the test voltage signal and the reference voltage signal.

10. The semiconductor integrated circuit as claimed in claim 1, comprising at least one fifth resistor configured in the same way as the third resistor, wherein the control circuitry is configured to control the at least one fifth resistor in the same way as the third resistor,
    optionally wherein the control circuitry is configured to control the at least one fifth resistor in the same way as the third resistor once the test voltage signal and the reference voltage signal have been brought into the target relationship.

11. The semiconductor integrated circuit as claimed in claim 10, wherein:
    the control circuitry is configured to control the third and at least one fifth resistor with a control signal having a variable control value;
    the control circuitry comprises a memory configured to store the control value based on which the test voltage signal and the reference voltage signal have been brought into the target relationship; and
    the control circuitry is configured, after having brought the test voltage signal and the reference voltage signal into the target relationship, to control the at least one fifth resistor using the control value stored in the memory.

12. The semiconductor integrated circuit as claimed in claim 10, wherein the at least one fifth resistor, or a said fifth resistor, is configured to act as a termination resistor at an external terminal of the semiconductor integrated circuit.

13. The semiconductor integrated circuit as claimed in claim 1, wherein the control circuitry is configured to control the reference voltage generator to adjust the first given voltage difference or the test voltage generator to adjust the second given voltage difference, so as to adjust a target resistance value to which the third resistor is calibrated.

14. The semiconductor integrated circuit as claimed in claim 1, being an IC chip or an output circuit.

15. An IC package, comprising:
    the semiconductor integrated circuit as claimed in claim 1; and
    the fourth resistor, wherein the fourth resistor is connected to the external terminal of the semiconductor integrated circuit.

16. The semiconductor integrated circuit as claimed in claim 1, wherein:
    the first resistor is connected between an intermediate node of the reference voltage generator and a first voltage source;
    the reference voltage generator is configured to regulate a voltage signal at the intermediate node of the reference voltage generator so that the first given voltage difference, the reference current flowing through the first resistor and the first resultant voltage difference are regulated; and
    the first part of the test voltage generator is configured, when the fourth resistor is connected to the external terminal, such that the fourth resistor is connected between an intermediate node of the test voltage generator the first voltage source or a second voltage source, and is further configured to regulate a voltage signal at the intermediate node of the test voltage generator so that the second given voltage difference, the test current flowing through the fourth resistor and the second resultant voltage difference are regulated.

* * * * *